United States Patent
Hull et al.

(10) Patent No.: US 7,800,250 B2
(45) Date of Patent: Sep. 21, 2010

(54) CONNECTION OF AN INTERNAL REGULATOR TO AN EXTERNAL FILTER/STABILIZATION CAPACITOR THROUGH A SELECTABLE EXTERNAL CONNECTION AND PREVENTION OF A CURRENT SURGE THEREBETWEEN

(75) Inventors: Richard Hull, Puyallup, WA (US); Vivien Delport, Chandler, AZ (US); Zacharias Marthinus Smit, Chandler, AZ (US); Sean Steedman, Phoenix, AZ (US); Jerrold S. Zdenek, Maricopa, AZ (US); Michael Charles, Gilbert, AZ (US); Ruan Lourens, Austin, TX (US)

(73) Assignee: Microchip Technology Incorporated, Chandler, AZ (US)

( * ) Notice: Subject to any disclaimer, the term of this patent is extended or adjusted under 35 U.S.C. 154(b) by 186 days.

(21) Appl. No.: 12/107,531

(22) Filed: Apr. 22, 2008

(65) Prior Publication Data
US 2008/0272657 A1    Nov. 6, 2008

Related U.S. Application Data

(60) Provisional application No. 60/916,052, filed on May 4, 2007.

(51) Int. Cl.
*H01H 47/02* (2006.01)
(52) U.S. Cl. .......................... 307/99; 307/98
(58) Field of Classification Search ............. 307/98–99; 323/299, 304, 311–313, 364
See application file for complete search history.

(56) References Cited

U.S. PATENT DOCUMENTS

| | | | |
|---|---|---|---|
| 3,743,764 A | 7/1973 | Wittmann | |
| 4,558,182 A * | 12/1985 | Perry et al. | 379/350 |
| 4,755,723 A * | 7/1988 | Sikora | 315/219 |
| 4,819,147 A | 4/1989 | Bingham | |
| 5,973,944 A * | 10/1999 | Nork | 363/60 |
| 6,023,156 A * | 2/2000 | Buhler | 323/284 |
| 6,968,055 B1 | 11/2005 | Dupuis et al. | |
| 7,049,760 B2 * | 5/2006 | Dowe | 315/241 P |
| 7,266,195 B1 | 9/2007 | Dupuis et al. | |

(Continued)

OTHER PUBLICATIONS

International Search Report and Written Opinion dated Sep. 17, 2008 for PCT/US2008/062477.

*Primary Examiner*—Jared Fureman
*Assistant Examiner*—Adi Amrany
(74) *Attorney, Agent, or Firm*—King & Spalding L.L.P.

(57) ABSTRACT

An integrated circuit device provides a choice of external pins (connections) that may be user selectable for coupling an external filter/stabilization capacitor to an internal voltage regulator. However, connecting the output of a internal voltage regulator to an uncharged external filter/stabilization capacitor (or to a capacitor charged to a different voltage level than the internal regulation voltage) through a low impedance path can cause the regulator output voltage to sag/spike if the internal voltage regulator tries to charge/discharge the capacitor up/down to equilibrium with the regulator output voltage. To minimize this potential sag/spike, the voltage on the external filter/stabilization capacitor may be adjusted in a controlled manner to substantially the same voltage as the voltage on the output of the internal voltage regulator, and then the internal voltage regulator is operationally coupled through a low impedance to the external regulator filter/stabilization capacitor.

27 Claims, 5 Drawing Sheets

U.S. PATENT DOCUMENTS

2004/0085690 A1    5/2004   Ito et al.
2006/0145673 A1*   7/2006   Fogg et al. .................. 323/282
2006/0285418 A1   12/2006   Aoki

* cited by examiner

CONNECTION OF AN INTERNAL REGULATOR TO AN EXTERNAL FILTER/STABILIZATION CAPACITOR THROUGH A SELECTABLE EXTERNAL CONNECTION AND PREVENTION OF A CURRENT SURGE THEREBETWEEN

RELATED PATENT APPLICATION

This application claims priority to commonly owned U.S. Provisional Patent Application Ser. No. 60/916,052; filed May 4, 2007; entitled "User Selectable Pin for an Internal Regulator Filter/Stabilization Capacitor Connection," by Richard Hull, Vivien Delport, Zacharias Marthinus Smit, Sean Steedman, Jerry Zdenek, Michael Charles and Ruan Lourens; which is hereby incorporated by reference herein for all purposes.

TECHNICAL FIELD

The present disclosure relates to integrated circuit devices having internal voltage regulators, and more particularly, to a user selectable external contact (pin) connection between an internal voltage regulator and an external filter/stabilization capacitor. In addition, preventing a current surge during voltage equalization between the internal voltage regulator and the external filter/stabilization capacitor is also accomplished.

BACKGROUND

Currently, most integrated circuit devices having an internal voltage regulator require an external regulator filter/stabilization capacitor to be used with the internal voltage regulator. Connection of the internal voltage regulator to an uncharged or overcharged external regulator filter/stabilization capacitor, e.g., during start-up or power interruption, may cause the output of the internal regulator to droop/spike and/or otherwise disrupt proper operation thereof. Flexibility in selection of which external connection (e.g., pin) of the integrated circuit device used for connection to the external regulator filter/stabilization capacitor is also very desirable. The ability to select which external connection (pin) that is used for connection to the external regulator filter/stabilization capacitor is especially advantageous for low pin-count integrated circuit devices where the external connections (e.g., pins) have multiple functions, since it is very difficult to know before hand and dedicate a specific fixed external connection for the external regulator filter/stabilization capacitor.

SUMMARY

Therefore there is a need to couple an external regulator filter/stabilization capacitor in a controlled manner so as not to disrupt the function of an internal voltage regulator of an integrated circuit device. There is also need to provide a convenient and flexible way of selecting an external connection, e.g., pin, of the integrated circuit device for coupling to the external regulator filter/stabilization capacitor. This is especially important when designing with low pin count integrated circuit packages and still be able to utilize one of those pin connections for an external regulator filter/stabilization capacitor when desired.

According to the teachings of this disclosure, an integrated circuit device, e.g. microprocessor, microcontroller, digital signal processor, application specific integrated circuit (ASIC), programmable logic array (PLA), etc., may provide a user selectable pin (external contention) of a plurality of pins on an integrated circuit device package to use for an external regulator filter/stabilization capacitor. This pin selection may occur during start-up of the integrated circuit device once power, e.g., Vdd, is applied thereto, and may be determined from pin allocation information stored in a nonvolatile memory of the integrated circuit device, e.g., fusible links, EEPROM, FLASH memory, etc. One of two conditions may exist during the pin selection process, for example, 1) pin selection is determined using only the power source voltage, Vdd, or 2) pin selection is determined using the internal voltage regulator voltage, e.g., with low voltage circuit logic).

If the internal voltage regulator voltage is not required in the pin selection process, the voltage regulator may be used to equalize the voltage (charge or discharge) the external filter capacitor without any special consideration regarding the stability of the internal voltage regulator before a voltage regulator ready acknowledgement is asserted. In this case, after the pin has been selected for the external capacitor the internal voltage regulator is coupled to the external capacitor for voltage equalization thereof, and finally once the voltage on the external capacitor is substantially the same value as the internal voltage regulator, then the internal voltage regulator is ready to power the low voltage circuits of the integrated circuit device.

However, if pin selection for the external capacitor is done with low voltage logic, e.g., low voltage nonvolatile memory, that requires a voltage from the internal voltage regulator then start-up of the integrated circuit device may require that initially the internal voltage regulator not be connected to the external capacitor. Connecting the output of the internal voltage regulator to an uncharged filter capacitor (or to a filter capacitor charged to a different voltage level than the internal regulation voltage) can cause the regulation voltage to sag/spike as it sources/absorbs charge to charge/discharge the capacitor up/down to the internal voltage regulator output voltage. Therefore, in order to minimize this sag/spike it is important to connect the capacitor to the internal voltage regulator output in a controlled manner. Processes for adjusting a voltage charge on the external regulator filter/stabilization capacitor to substantially the same voltage as the voltage from the internal voltage regulator, and then coupling the external regulator filter/stabilization capacitor to the internal voltage regulator in a controlled manner is further disclosed herein.

According to a specific example embodiment of this disclosure, an integrated circuit device having an internal voltage regulator and selectable external connections, wherein at least one of which is selected for coupling the internal voltage regulator to an external capacitor comprises: a voltage regulator; a plurality of external connections; and a first circuit for selecting a one of the plurality of external connections and coupling the voltage regulator to the selected one of the plurality of external connections, wherein the selected one of the plurality of external connections is coupled to an external capacitor.

According to another specific example embodiment of this disclosure, an integrated circuit device having an internal voltage regulator and selectable external connections, wherein at least one of which is selected for coupling the internal voltage regulator to an external capacitor comprises: a voltage regulator; a plurality of external connections; a first circuit for selecting a one of the plurality of external connections, the selected one of the plurality of external connections is coupled to an external capacitor having an unknown voltage thereon, wherein the first circuit adjusts the unknown voltage on the external capacitor through a high impedance path to a voltage substantially the same value as a voltage of the voltage regulator; and a second circuit for coupling the voltage regulator through a low impedance path to the selected one of the plurality of external connections when the voltage thereon is substantially the same value as the voltage of the voltage regulator.

According to yet another specific example embodiment of this disclosure, an integrated circuit device having an internal voltage regulator and selectable external connections, wherein at least one of which is selected for coupling the internal voltage regulator to an external capacitor comprises: a voltage regulator; a plurality of external connections; and a circuit for selecting a one of the plurality of external connections and adjusting a voltage thereon, the selected one of the plurality of external connections is coupled to an external capacitor having an unknown voltage, wherein the circuit adjusts the unknown voltage on the external capacitor through a high impedance path to a voltage substantially the same value as a voltage of the voltage regulator then couples the selected one of the plurality of external connections through a low impedance path to the voltage regulator.

According to still another specific example embodiment of this disclosure, a method for selecting an external connection for coupling an internal voltage regulator to an external capacitor comprises the steps of: providing a voltage regulator in an integrated circuit device; providing a plurality of external connections for the integrated circuit device; and selecting a one of the plurality of external connections for coupling to the voltage regulator, the selected one of the plurality of external connections being coupled to an external capacitor.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Figure 1:
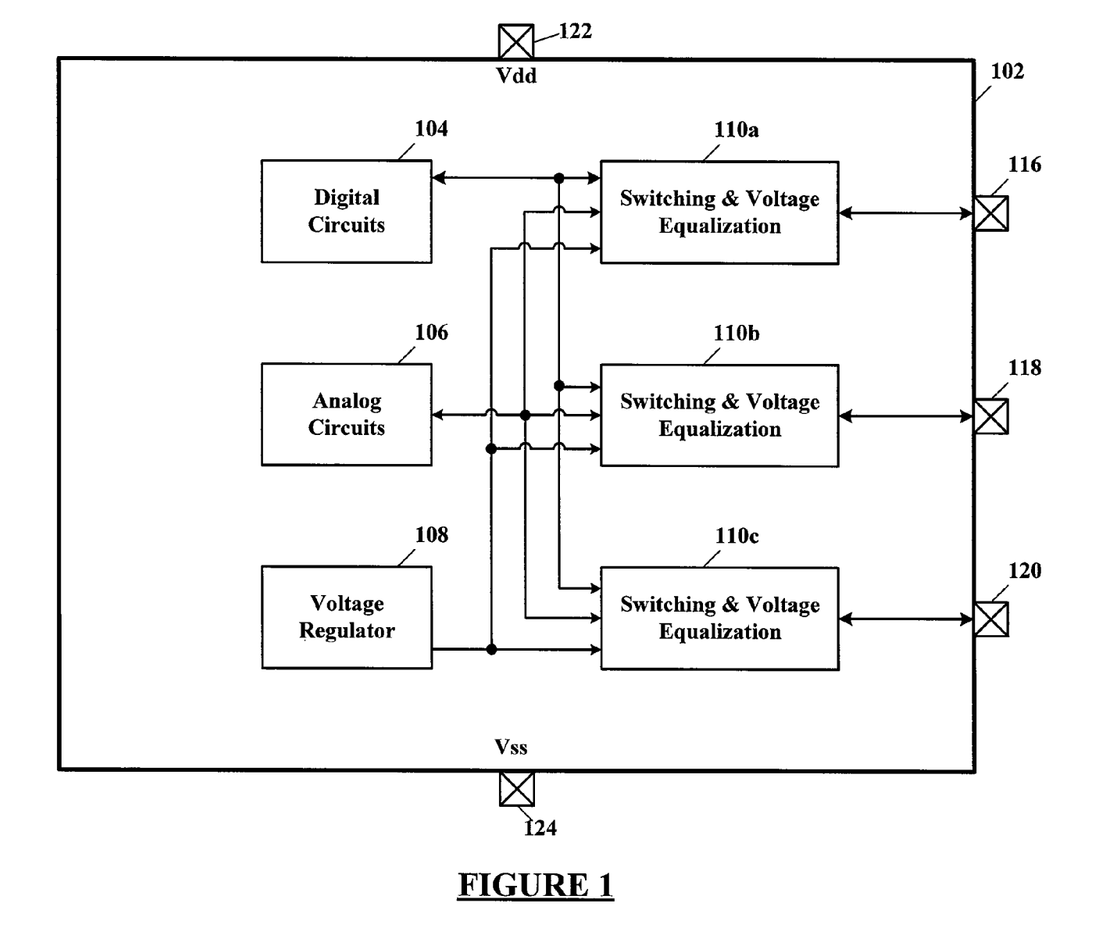
FIG. 1 is a schematic block diagram of an integrated circuit device having external pin connections that are selectable for coupling to digital and/or analog circuits, and to an external regulator filter/stabilization capacitor for use with an internal voltage regulator, according to teachings of this disclosure.

Referring to FIG. 1, depicted is a schematic block diagram of an integrated circuit device having external pin connections that are selectable for coupling to digital and/or analog circuits, and to an external regulator filter/stabilization capacitor for use with an internal voltage regulator. An integrated circuit device 102 may comprise digital circuits 104, e.g., registers, memory, central processing units, counters, latches, timers, combinatorial logic, etc.; analog circuits 106, e.g., analog-to-digital converters, digital-to-analog converters, etc.; and an internal voltage regulator 108.

The integrated circuit device 102 may be packaged in an integrated circuit package (not shown) where the pins (external connections on the package) may be selectively coupled to designated ones of the digital circuits 104 and/or the analog circuits 106 of the integrated circuit device 102. This is especially advantageous when designing with low pin count integrated circuit packages, however, integrated circuit packages of any pin count can benefit from the teachings of this disclosure. A plurality of switching and voltage equalization circuits 110 (three shown for demonstrative clarity) may be used to couple pins 116, 118 and 120 to selected ones of the digital circuits 104, the analog circuits 106 and/or the internal voltage regulator 108 of the integrated circuit device 102, according to a desired application thereof. It is contemplated and within the scope of this disclosure that the plurality of switching and voltage equalization circuits 110 may be one multi-input/output signal switching and voltage equalization circuit, e.g., cross point switch matrix with voltage equalization components. It is also contemplated and within the scope of this disclosure that the voltage equalization components may be associated with the internal voltage regulator, and the plurality of signal switching circuits remain independent therefrom. One having ordinary skill in the art of digital circuit design and having the benefit of the teachings of this disclosure would readily understand how to implement an optimal combination of signal switching and voltage equalization components when designing an integrated circuit device.

A power source voltage, Vdd, may be coupled to pin 122 and a power source common, Vss, may be coupled to pin 124. The integrated circuit device 102 may be a mixed signal device, e.g., having both analog and digital circuits, and may also include a central processing unit (CPU), interface logic and memory, e.g., volatile and/or non-volatile memory. The integrated circuit device 102 may be, for example but limited to, microprocessor, microcontroller, digital signal processor, application specific integrated circuit (ASIC), programmable logic array (PLA), etc.

Figure 2:
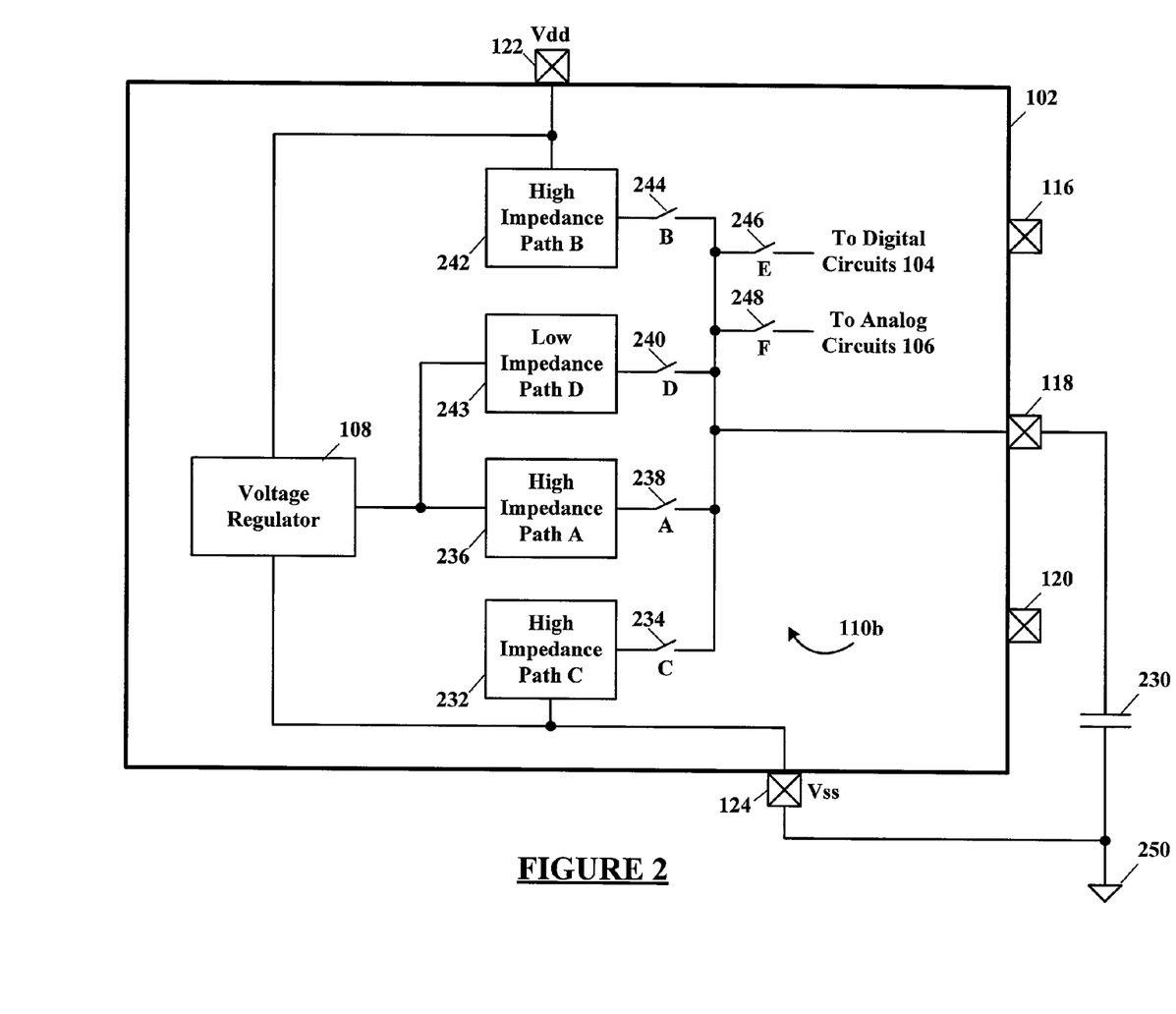
FIG. 2 is a more detailed schematic block diagram of the internal voltage regulator portion of the integrated circuit device of FIG. 1 showing apparatus and methods of coupling an external regulator filter/stabilization capacitor to the internal voltage regulator in a controlled manner, according to teachings of this disclosure.

Referring to FIG. 2, depicted is a more detailed schematic block diagram of the internal voltage regulator portion of the integrated circuit device of FIG. 1 showing apparatus and methods of coupling an external regulator filter/stabilization capacitor to the internal voltage regulator in a controlled manner, according to teachings of this disclosure. If external pin selection relies on logic requiring a voltage from the internal voltage regulator 108, then directly coupling the external regulator filter/stabilization capacitor 230 with an unknown voltage charge to the output of the voltage regulator 108 may cause instability thereto, e.g., voltage undershoot or overshoot which is undesirable. Therefore it is preferable that before the external regulator filter/stabilization capacitor 230 is coupled to the output of the voltage regulator 108, the voltage charge on the external regulator filter/stabilization capacitor 230 be substantially the same value as the regulated output voltage from the voltage regulator 108. These steps are not needed if the external pin selection is determined by logic circuits not requiring voltage from the internal voltage regulator, then external regulator filter/stabilization capacitor 230 may be directly coupled through the external pin 118 to the voltage regulator 108 and the voltage on the external regulator filter/stabilization capacitor 230 be adjusted directly by the internal voltage regulator 108 through the low impedance path 243.

Coupling the voltage regulator 108 to the external regulator filter/stabilization capacitor 230 may be accomplished in several ways. For example, if the external regulator filter/stabilization capacitor 230 has little or no voltage charge thereon, then a controlled voltage may be applied to the filter/stabilization capacitor 230 until a desired voltage value is reached. If the external regulator filter/stabilization capacitor 230 has a voltage charge greater than desired, then the external regulator filter/stabilization capacitor 230 may be discharged until the desired voltage value is reached. Once the desired voltage value has been reached, e.g., substantially the same voltage as the output of the voltage regulator 108, the filter/stabilization capacitor 230 may be coupled to the output of the voltage regulator 108 without causing voltage instability thereto.

The switching and voltage equalization circuit 110b may be used to charge and/or discharge the external regulator filter/stabilization capacitor 230 while isolating the output of the voltage regulator 108 from the external regulator filter/stabilization capacitor 230 until it has reached the desired voltage value (substantially the same voltage as the output of the voltage regulator 108), as more fully disclosed herein.

Switches 246 and 248 are used to couple external pins to the digital circuits 104 or the analog circuits 106, respectively. In the following explanations, the switches 246 and 248 remain open since external pin 118 is being used only for connection to the external regulator filter/stabilization capacitor 230. If the external pin 118 or any other pin 116, 120, etc., was being used for the digital circuits 104 or the analog circuits 106, then switch 246 or 248, respectively, would be closed and the other switches 234, 238, 240 and 244 would remain open.

Charging the external regulator filter/stabilization capacitor 230 to the desired voltage value, may be accomplished by closing switch 244 while switches 240, 238 and 234 remain open. The external regulator filter/stabilization capacitor 230 is thereby charged from the power source terminal 122, Vdd, until reaching the desired voltage value. The high impedance path 242 limits the magnitude of current during this voltage charging operation. Once the external regulator filter/stabilization capacitor 230 has charged to the desired voltage value, switch 244 opens and switch 240 closes. When switch 240 is closed the external regulator filter/stabilization capacitor 230 is coupled to the output of the voltage regulator 108 through a low impedance path 243. Thereafter the voltage regulator 108 can operate normally with the external regulator filter/stabilization capacitor 230.

Discharging the external regulator filter/stabilization capacitor 230 to the desired voltage value may also be accomplished by closing switch 234 while switches 240, 238 and 244 remain open. The external regulator filter/stabilization capacitor 230 is thereby discharged into the power common terminal 124, Vss, until reaching the desired voltage value. The high impedance path 232 limits the magnitude of current during this voltage discharging operation. Once the external regulator filter/stabilization capacitor 230 has discharged to the desired voltage value, switch 234 opens and switch 240 closes. When switch 240 closes the external regulator filter/stabilization capacitor 230 is coupled to the output of the voltage regulator 108 through the low impedance path 243. Thereafter the voltage regulator 108 can operate normally with the external regulator filter/stabilization capacitor 230.

Charging/discharging of the external regulator filter/stabilization capacitor 230 to the desired voltage value may also be accomplished by closing switch 238 while switches 240, 234 and 244 remain open. The external regulator filter/stabilization capacitor 230 is thereby charged/discharged by being coupled to the output of the voltage regulator 108 through a high impedance path 236 until reaching the desired voltage value. The high impedance path 236 limits the magnitude of current during this voltage charging/discharging operation. Once the external regulator filter/stabilization capacitor 230 has discharged/discharged to the desired voltage value, switch 238 opens and switch 240 closes. When switch 240 is closed the external regulator filter/stabilization capacitor 230 is coupled to the output of the voltage regulator 108 through the low impedance path 243. Thereafter the voltage regulator 108 can operate normally with the external regulator filter/stabilization capacitor 230.

Figure 3:
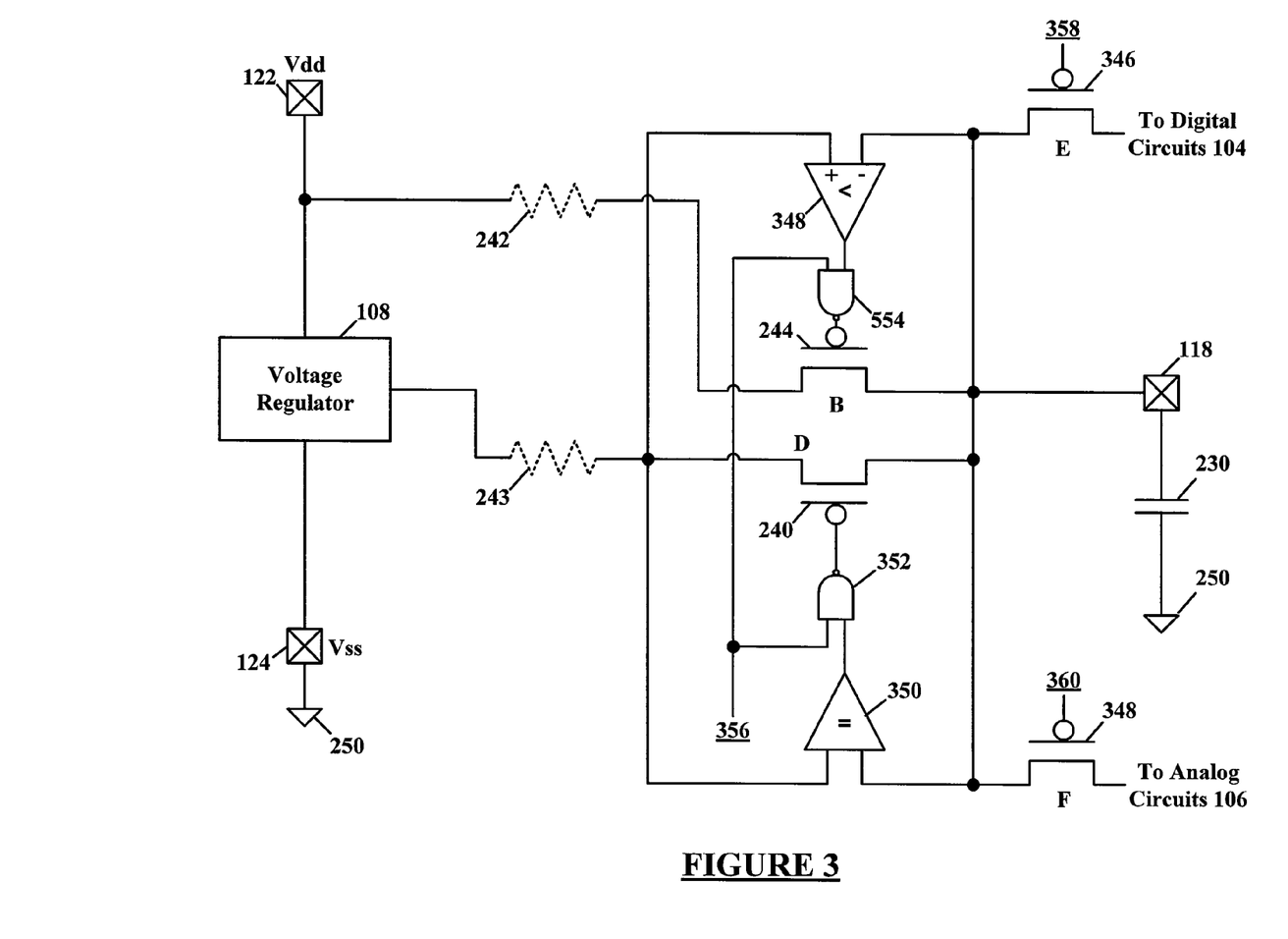
FIG. 3 is a schematic diagram of a portion of the integrated circuit device of FIG. 2 showing a circuit for charging the external regulator filter/stabilization capacitor to a desired voltage then coupling the external regulator filter/stabilization capacitor to the internal voltage regulator in a controlled manner, according to a specific example embodiment of this disclosure.

Referring to FIG. 3, depicted is a schematic diagram of a portion of the integrated circuit device of FIG. 2 showing a circuit for charging the external regulator filter/stabilization capacitor to a desired voltage then coupling the external regulator filter/stabilization capacitor to the internal voltage regulator in a controlled manner. The switches 244 and 240, e.g., metal oxide semiconductor field effect transistors (MOSFETs), are used to couple the external regulator filter/stabilization capacitor 230 to the power source, Vdd, at pin 122 through a high impedance path 242 when switch 244 is closed and switch 240 is open, or to the output of the internal voltage regulator 108 when switch 244 is open and switch 240 is closed. Thus coupling together the external regulator filter/stabilization capacitor 230 and the output of the internal voltage regulator 108 through the low impedance path 243.

This circuit may be effectively used when the voltage on the external regulator filter/stabilization capacitor 230 is less than the voltage on the output of the internal voltage regulator 108. When switch 244 is closed and switch 240 is open, the lower voltage on the external regulator filter/stabilization capacitor 230 will charge to an equilibrium voltage, substantially the same value, e.g., within 50 to 100 millivolts, as the voltage at the output of the voltage regulator, at a current determined by the high impedance path 242. Once the voltage on the external regulator filter/stabilization capacitor 230 is substantially the same value as (in equilibrium with) the voltage at the output of the voltage regulator 108, switch 244 will open and switch 240 will close. Now the output of the voltage regulator 108 is coupled to the external regulator filter/stabilization capacitor 230 through the low impedance path 243. The high impedance path 242 and the low impedance path 243 may be inherent in the design of the switches 244 and 240, respectively, since the physical size of a MOSFET transistor switch determines the on resistance thereof.

A voltage comparator 348 may be used to control the switch 244 on when the voltage on the external regulator filter/stabilization capacitor 230 is less than the voltage at the output of the voltage regulator 108. A voltage comparator 350 may be used to monitor the voltages at the output of the voltage regulator 108 and the external regulator filter/stabilization capacitor 230 so that when both voltages are substantially the same value, automatic control of the switches 244 and 240 occur as described hereinabove. NAND gates 352 and 554 are shown for illustrative purposes only, many other logic designs may be used with equal effect as would be known to those having ordinary skill in digital logic design and having the benefit of the teachings of this disclosure. The comparators 348 and 350 may have hysteresis built in and/or will latch to prevent output chatter when the input voltages are approaching substantially the same values.

The MOSFET switches 240, 244, 346 and 348 may be used for the multiplexer functions. An enable control line 356 may be included to enable/disable operation of this control circuit when the associated external connection (pin) it is not being used to couple the voltage regulator 108 to the external regulator filter/stabilization capacitor 230, e.g., when the external pin 118 is used for a digital circuit 104 or an analog circuit 106, by closing switch 346 or 348, respectively. In that case, switch 346 will couple the digital circuit 104 to the external pin 118 when controlled by the control line 358, and switch 348 will couple the analog circuit 106 to the external pin 118 when controlled by the control line 360.

Figure 4:
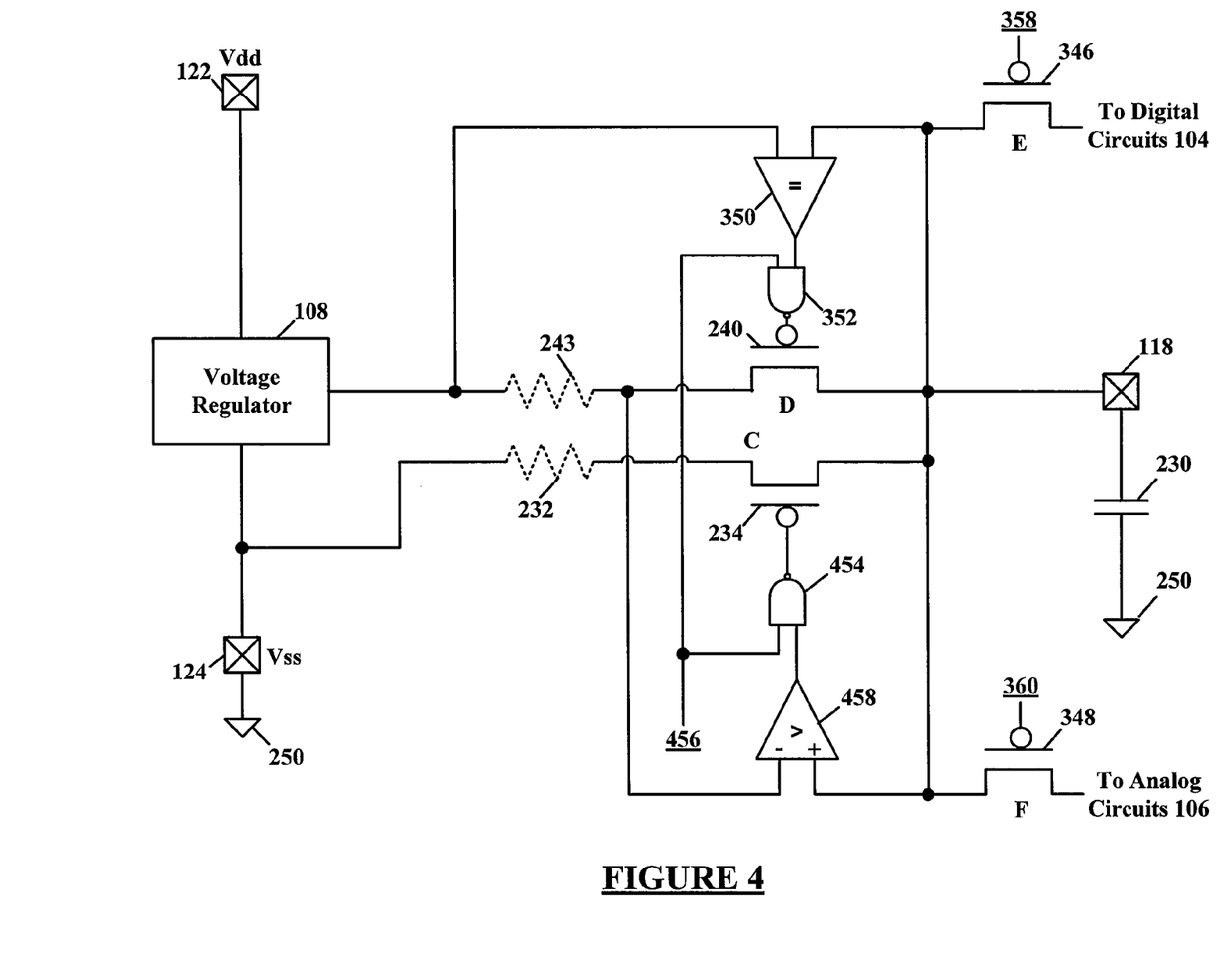
FIG. 4 is a schematic diagram of a portion of the integrated circuit device of FIG. 2 showing a circuit for discharging the external regulator filter/stabilization capacitor to a desired voltage then coupling the external regulator filter/stabilization capacitor to the internal voltage regulator in a controlled manner, according to another specific example embodiment of this disclosure.

Referring to FIG. 4, depicted is a schematic diagram of a portion of the integrated circuit device of FIG. 2 showing a circuit for discharging the external regulator filter/stabilization capacitor to a desired voltage then coupling the external regulator filter/stabilization capacitor to the internal voltage regulator in a controlled manner. The switches 234 and 240, e.g., metal oxide semiconductor field effect transistors (MOSFETs), are used to couple the external regulator filter/stabilization capacitor 230 to the power source common (represented as common connection 250) through a high impedance path 232 when switch 234 is closed and switch 240 is open, or to the output of the internal voltage regulator 108 when switch 234 is open and switch 240 is closed. Thus coupling together the external regulator filter/stabilization capacitor 230 and the output of the internal voltage regulator 108 through the low impedance path 243.

This circuit may be effectively used when the voltage on the external regulator filter/stabilization capacitor 230 is greater than the voltage on the output of the internal voltage regulator 108. When switch 234 is closed and switch 240 is open, the higher voltage on the external regulator filter/stabilization capacitor 230 will discharge to an equilibrium voltage, substantially the same value as the voltage at the output of the voltage regulator, at a current determined by the high impedance path 232. Once the voltage on the external regulator filter/stabilization capacitor 230 is substantially the same value, e.g., within 50 to 100 millivolts, as (in equilibrium with) the voltage at the output of the voltage regulator 108, switch 234 will open and switch 240 will close. Now the output of the voltage regulator 108 is coupled to the external regulator filter/stabilization capacitor 230 through the low impedance path 243. The high impedance path 232 and the low impedance path 243 may be inherent in the design of the switches 234 and 240, respectively, since the physical size of a MOSFET transistor switch determines the on resistance thereof.

A voltage comparator 458 may be used to control the switch 234 on when the voltage on the external regulator filter/stabilization capacitor 230 is greater than the voltage at the output of the voltage regulator 108. A voltage comparator 350 may be used to monitor the voltages at the output of the voltage regulator 108 and the external regulator filter/stabilization capacitor 230 so that when both voltages are substantially the same value, automatic control of the switches 234 and 240 occur as described hereinabove. NAND gates 352 and 454 are shown for illustrative purposes only, many other logic designs may be used with equal effect as would be known to those having ordinary skill in digital logic design and having the benefit of the teachings of this disclosure. The comparators 458 and 350 may have hysteresis built in and/or will latch to prevent output chatter when the input voltages are approaching substantially the same values.

The MOSFET switches 234, 240, 346 and 348 may be used for the multiplexer functions. An enable control line 456 may be included to enable/disable operation of this control circuit when the associated external connection (pin) it is not being used to couple the voltage regulator 108 to the external regulator filter/stabilization capacitor 230, e.g., when the external pin 118 is used for a digital circuit 104 or an analog circuit 106, by closing switch 346 or 348, respectively. In that case, switch 346 will couple the digital circuit 104 to the external pin 118 when controlled by the control line 358, and switch 348 will couple the analog circuit 106 to the external pin 118 when controlled by the control line 360.

Figure 5:
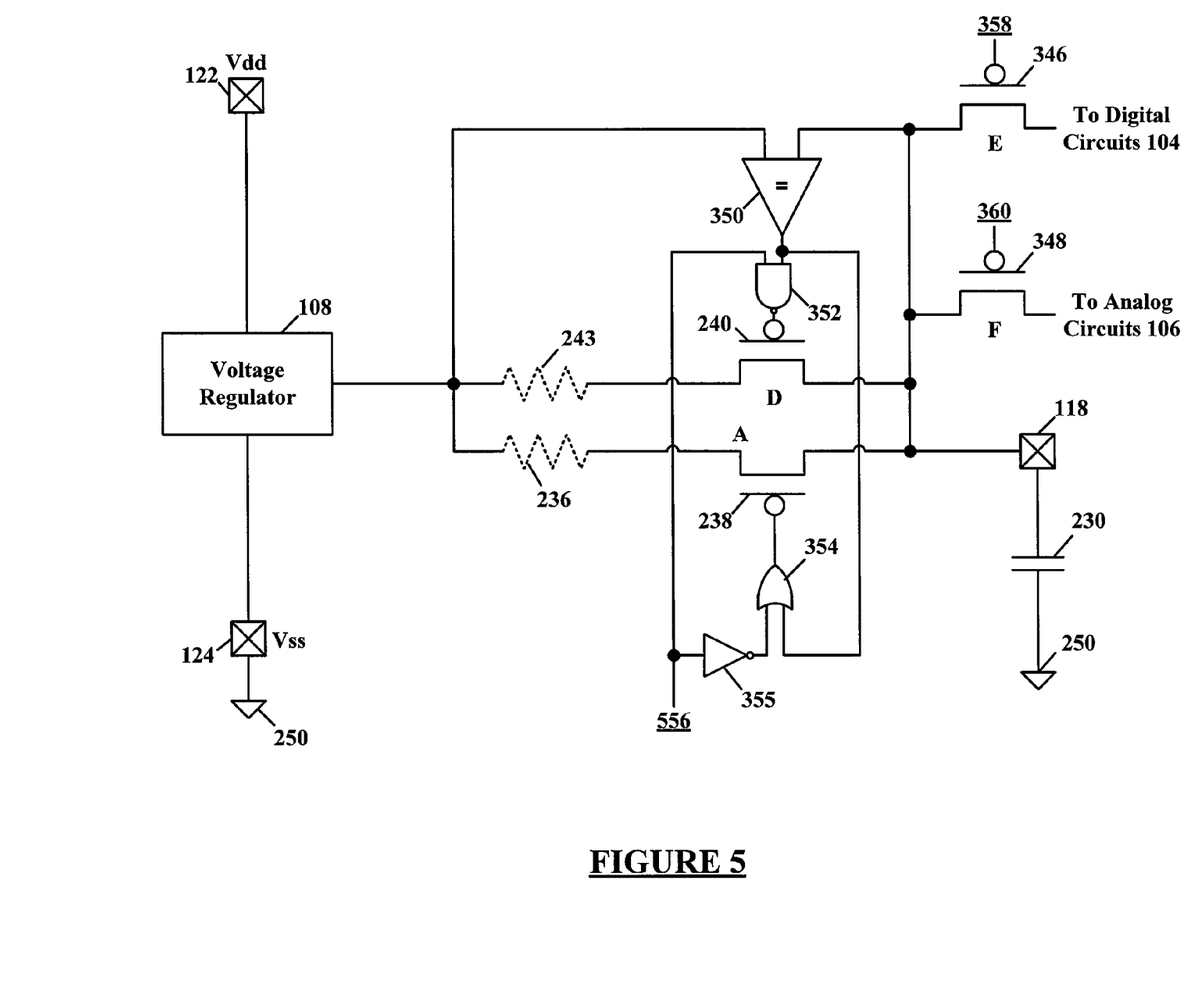
FIG. 5 is a schematic diagram of a portion of the integrated circuit device of FIG. 2 showing a circuit for charging and discharging the external regulator filter/stabilization capacitor to a desired voltage then coupling the external regulator filter/stabilization capacitor to the internal voltage regulator in a controlled manner, according to yet another specific example embodiment of this disclosure.

Referring to FIG. 5, depicted is a schematic diagram of a portion of the integrated circuit device of FIG. 2 showing a circuit for charging and discharging the external regulator filter/stabilization capacitor to a desired voltage then coupling the external regulator filter/stabilization capacitor to the internal voltage regulator in a controlled manner. The switches 238 and 240, e.g., metal oxide semiconductor field effect transistors (MOSFETs), are used to select either high impedance or low impedance paths between the output of the internal voltage regulator 108 and the external regulator filter/stabilization capacitor 230.

When switch 238 is closed and switch 240 is open the output of the voltage regulator 108 is coupled through the high impedance path 236 and the external pin 118 to the external regulator filter/stabilization capacitor 230. Whereby the voltage charge on the external regulator filter/stabilization capacitor 230 will be brought into equilibrium with the voltage at the output of the voltage regulator 108. For example, when the voltage on the external regulator filter/stabilization capacitor 230 is less than the voltage at the output of the voltage regulator 108, the external regulator filter/stabilization capacitor 230 will be charged to an equilibrium voltage at a current determined by the value of the high impedance path 236. When the voltage on the external regulator filter/stabilization capacitor 230 is greater than the voltage at the output of the voltage regulator 108, the external regulator filter/stabilization capacitor 230 will be discharged to an equilibrium voltage at a current determined by the value of the high impedance path 236.

Once the voltage on the external regulator filter/stabilization capacitor 230 is substantially the same value as, e.g., within 50 to 100 millivolts, (in equilibrium with) the voltage at the output of the voltage regulator 108, switch 238 will open and switch 240 will close. Now the output of the voltage regulator 108 is coupled to the external regulator filter/stabilization capacitor 230 through the low impedance path 243. A voltage comparator 350 may be used to monitor the voltages at the output of the voltage regulator 108 and the external regulator filter/stabilization capacitor 230 so that when both voltages are substantially the same value, automatic control of the switches 238 and 240 occur as described hereinabove. NAND gate 352, OR gate 354 and inverter 355 are shown for illustrative purposes only, many other logic designs may be used with equal effect as would be known to those having ordinary skill in digital logic design and having the benefit of the teachings of this disclosure. The comparator 350 may have hysteresis built in and/or will latch to prevent output chatter when the input voltages are approaching substantially the same values.

The MOSFET switches 238, 240, 346 and 348 may be used for the multiplexer functions. An enable control line 556 may be included to enable/disable operation of this control circuit when the associated external connection (pin) it is not being used to couple the voltage regulator 108 to the external regulator filter/stabilization capacitor 230, e.g., when the external pin 118 is used for a digital circuit 104 or an analog circuit 106, by closing switch 346 or 348, respectively. In that case, switch 346 will couple the digital circuit 104 to the external pin 118 when controlled by the control line 358, and switch 348 will couple the analog circuit 106 to the external pin 118 when controlled by the control line 360.

It is contemplated and within the scope of this disclosure that the external pin selection may be performed with logic operating at external supply voltage, Vdd, without requiring controlled voltage equalization of an external regulator filter/stabilization capacitor. Then equalization of the external regulator filter/stabilization capacitor may be performed directly by the internal voltage regulator but before low voltage circuits of the integrated circuit device come on line needing a stable low voltage from the internal voltage regulator, e.g., before the internal voltage regulator indicated that it is ready to supply a stable voltage.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device having an internal voltage regulator and selectable external connections, wherein at least one of which is selected for coupling the internal voltage regulator to an external capacitor, said integrated circuit device comprising:
    a voltage regulator;
    a plurality of external connections;
    a first circuit for selecting one of the plurality of external connections, the selected one of the plurality of external connections is coupled to an external capacitor having an unknown voltage thereon, wherein the first circuit adjusts the unknown voltage on the external capacitor through a high impedance path to a voltage substantially the same value as a voltage of the voltage regulator; and
    a second circuit for coupling the voltage regulator through a low impedance path to the selected one of the plurality of external connections when the voltage thereon is substantially the same value as the voltage of the voltage regulator.

2. The integrated circuit device according to claim 1, wherein the first circuit couples a power source voltage through the high impedance path to the selected one of the plurality of external connections when a voltage thereon is less than the voltage of the voltage regulator.

3. The integrated circuit device according to claim 1, wherein the first circuit couples a power source voltage return through the high impedance path to the selected one of the plurality of external connections when a voltage thereon is greater than the voltage of the voltage regulator.

4. The integrated circuit device according to claim 1, wherein the first circuit couples the voltage regulator through a high impedance to the selected one of the plurality of external connections when a voltage thereon is not substantially the same value as the voltage of the voltage regulator.

5. The integrated circuit device according to claim 1, wherein the capacitor is an external regulator filter/stabilization capacitor used in combination with the voltage regulator.

6. The integrated circuit device according to claim 1, further comprising a third circuit for coupling a digital circuit to another one of the plurality of external connections.

7. The integrated circuit device according to claim 1, further comprising a fourth circuit for coupling an analog circuit to another one of the plurality of external connections.

8. The integrated circuit device according to claim 1, wherein the integrated circuit device is a microcontroller.

9. The integrated circuit device according to claim 1, wherein the integrated circuit device is selected from any one of the group consisting of a microprocessor, digital signal processor, application specific integrated circuit (ASIC), and programmable logic array (PLA).

10. The integrated circuit device according to claim 1, wherein the second circuit latches to maintain the low impedance path.

11. An integrated circuit device having an internal voltage regulator and selectable external connections, wherein at least one of which is selected for coupling the internal voltage regulator to an external capacitor, said integrated circuit device comprising:
    a voltage regulator;
    a plurality of external connections; and
    a circuit for selecting one of the plurality of external connections and adjusting a voltage thereon, the selected one of the plurality of external connections is coupled to an external capacitor having an unknown voltage, wherein the circuit adjusts the unknown voltage on the external capacitor through a high impedance path to a voltage substantially the same value as a voltage of the voltage regulator then couples the selected one of the plurality of external connections through a low impedance path to the voltage regulator.

12. The integrated circuit device according to claim 11, wherein the circuit comprises:
    a first switch having a low impedance path, the first switch couples the voltage regulator to the selected one of the plurality of external connections when a voltage thereon is substantially the same value as the voltage of the voltage regulator;
    a second switch having a high impedance path, wherein if the unknown voltage on the external capacitor is less than the voltage of the voltage regulator then the second switch couples a power source voltage to the selected one of the plurality of external connections until the voltage thereon is substantially the same value as the voltage of the voltage regulator; and
    a third switch having a high impedance path, wherein if the unknown voltage on the external capacitor is greater than the voltage of the voltage regulator then the second switch couples a power source voltage return to the selected one of the plurality of external connections until the voltage thereon is substantially the same value as the voltage of the voltage regulator.

13. The integrated circuit device according to claim 12, wherein the first, second and third switches are first, second and third metal oxide semiconductor field effect transistors (MOSFETs), respectively.

14. The integrated circuit device according to claim 13, wherein the first MOSFET is designed to have a low impedance path when on, and the second and third MOSFETs are designed to have a high impedance path when on.

15. The integrated circuit device according to claim 11, wherein the circuit comprises:
 a first switch having a low impedance path, the first switch couples the voltage regulator to the selected one of the plurality of external connections when a voltage thereon is substantially the same value as the voltage of the voltage regulator; and
 a second switch having a high impedance path, wherein if the unknown voltage on the external capacitor is not substantially the same value as the voltage of the voltage regulator then the second switch couples the voltage regulator through the high impedance path to the selected one of the plurality of external connections until the voltage thereon is substantially the same value as the voltage of the voltage regulator.

16. The integrated circuit device according to claim 15, wherein the first, second and third switches are first, second and third metal oxide semiconductor field effect transistors (MOSFETs), respectively.

17. The integrated circuit device according to claim 16, wherein the first MOSFET is designed to have a low impedance path when on, and the second MOSFET is designed to have a high impedance path when on.

18. The integrated circuit device according to claim 11, wherein the capacitor is an external regulator filter/stabilization capacitor used in combination with the voltage regulator.

19. The integrated circuit device according to claim 11, further comprising a fourth switch for coupling a digital circuit to another one of the plurality of external connections.

20. The integrated circuit device according to claim 11, further comprising a fifth switch for coupling an analog circuit to another one of the plurality of external connections.

21. The integrated circuit device according to claim 11, wherein the integrated circuit device is a microcontroller.

22. The integrated circuit device according to claim 11, wherein the integrated circuit device is selected from any one of the group consisting of a microprocessor, digital signal processor, application specific integrated circuit (ASIC), and programmable logic array (PLA).

23. The integrated circuit device according to claim 11, wherein the circuit latches to maintain the low impedance path.

24. A method for selecting an external connection for coupling an internal voltage regulator to an external capacitor, said method comprising the steps of:
 providing a voltage regulator in an integrated circuit device;
 providing a plurality of external connections for the integrated circuit device;
 connecting an external capacitor to one of the plurality of external connections;
 adjusting a voltage on the external capacitor by coupling the one of the plurality of external connections through a high impedance path to a power source voltage when a voltage thereon is less than the voltage of the voltage regulator and to a power source voltage return when the voltage thereon is greater than the voltage of the voltage regulator; and
 coupling the voltage regulator to the one of the plurality of external connections through a low impedance path after the external capacitor is at substantially the same voltage as the voltage regulator.

25. The method according to claim 24, further comprising the step of coupling a digital circuit to another one of the plurality of external connections.

26. The method according to claim 24, further comprising the step of coupling an analog circuit to another one of the plurality of external connections.

27. A method for selecting an external connection for coupling an internal voltage regulator to an external capacitor, said method comprising the steps of:
 providing a voltage regulator in an integrated circuit device;
 providing a plurality of external connections for the integrated circuit device;
 connecting an external capacitor to one of the plurality of external connections;
 adjusting a voltage on the external capacitor by coupling the one of the plurality of external connections through a high impedance path to the voltage regulator; and
 coupling the one of the plurality of external connections through a low impedance path to the voltage regulator after the external capacitor is at substantially the same voltage as the voltage regulator.

* * * * *